United States Patent
Hsu et al.

(10) Patent No.: US 10,630,268 B2
(45) Date of Patent: Apr. 21, 2020

(54) VOLTAGE LEVEL SHIFTER CIRCUIT

(71) Applicant: Realtek Semiconductor Corp., HsinChu (TW)

(72) Inventors: Hsin-Cheng Hsu, Hsinchu County (TW); Tay-Her Tsaur, Hsinchu County (TW); Po-Ching Lin, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/252,689

(22) Filed: Jan. 20, 2019

(65) Prior Publication Data

US 2019/0379365 A1    Dec. 12, 2019

(30) Foreign Application Priority Data

Jun. 11, 2018 (TW) .............................. 107120041 A

(51) Int. Cl.
*H03K 3/356* (2006.01)
*H03K 19/0185* (2006.01)

(52) U.S. Cl.
CPC .................. *H03K 3/356113* (2013.01); *H03K 19/018521* (2013.01)

(58) Field of Classification Search
CPC ....... H03K 19/0013; H03K 19/018521; H03K 19/018528; H03K 19/00315; H03K 3/356113; G11C 8/08; G11C 5/145; G11C 7/12
See application file for complete search history.

(56) References Cited

U.S. PATENT DOCUMENTS 8,710,897 B2 *    4/2014 Kim ................. H03K 3/356113
                                        327/333
2018/0204503 A1 *   7/2018 Tsuchi ................. G09G 3/2092

FOREIGN PATENT DOCUMENTS

| JP | 2013-162311 A | 8/2013 |
| TW | 200729723 | 8/2007 |
| TW | 201515391 A | 4/2015 |

* cited by examiner

*Primary Examiner* — Long Nguyen
(74) *Attorney, Agent, or Firm* — Winston Hsu

(57) ABSTRACT

A voltage level shifter circuit, including: a first control circuit, arranged to receive an input voltage and generate a first control signal; a first pull-down circuit, arranged to determine whether to pull down a first output voltage to a first reference voltage according to the first control signal; a first pull-up circuit, arranged to determine whether to pull up the first output voltage to a second reference according to a first inverse output voltage; a second control circuit, arranged to generate a second control signal according to the first output voltage; a second pull-down circuit, arranged to determine whether to pull down a second output voltage to the second reference voltage according to the second control signal; and a second pull-up circuit, arranged to determine whether to pull up the second output voltage to a third reference voltage according to a second inverse output voltage.

14 Claims, 8 Drawing Sheets

US 10,630,268 B2

VOLTAGE LEVEL SHIFTER CIRCUIT

BACKGROUND OF THE INVENTION

1. Field of the Invention

The present invention relates to electronic circuits, and more particularly, to a voltage level shifter circuit.

2. Description of the Prior Art

Developments of Complementary Metal-Oxide-Semiconductor (CMOS) technology is rapidly performed, sizes of transistors are continuously shrunk to reduce chip areas, and thereby operating speed increases and power consumption can be saved. However, while the sizes of the transistors are continuously shrunk, gate oxides and transistor channels are continuously shrunk as well, allowable voltage difference between any two terminals of electrodes of the transistors (e.g. gate, drain, source and bulk/body) is reduced. When a voltage difference between any two terminals of a transistor exceeds a nominal voltage, the transistor may be damaged. Since the nominal voltage of advanced CMOS process is getting lower, conventional CMOS voltage level shifter circuit may have problems such as power source voltage being higher than the nominal voltage, which may damage the transistors.

SUMMARY OF THE INVENTION

An objective of the present invention is to provide a voltage level shifter circuit to solve the aforementioned problems.

According to an embodiment of the present invention, a voltage level shifter circuit is disclosed. The voltage level shifter circuit comprises: an input terminal, a first output terminal, a first inverse output terminal, a second output terminal, a second inverse output terminal, a first control circuit, a first pull-down circuit, a first pull-up circuit, a second control circuit, a second pull-down circuit and a second pull-up circuit. The first control circuit receives an input voltage from the input terminal and generates a first control signal. The first pull-down circuit is coupled to the first control circuit, and determines whether to pull down a voltage level of a first output voltage on the first output terminal to a first reference voltage according to the first control signal. The first pull-up circuit is coupled to the first pull-down circuit, and determines whether to pull up the first output voltage on the first output terminal to a second reference voltage according to a first inverse output voltage on the first inverse output terminal, wherein the second reference voltage is greater than the first reference voltage. The second control circuit is coupled to the first output terminal, and generates a second control signal at least according to the first output voltage. The second pull-down circuit is coupled to the second control circuit, and determines whether to pull down a voltage level of a second output voltage on the second output terminal to the second reference voltage according to the second control signal. The second pull-up circuit is coupled to the second pull-down circuit, and determines whether to pull up the second output voltage on the second output terminal to a third reference voltage according to a second inverse output voltage on the second inverse output terminal, wherein the third reference voltage is greater than the second reference voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
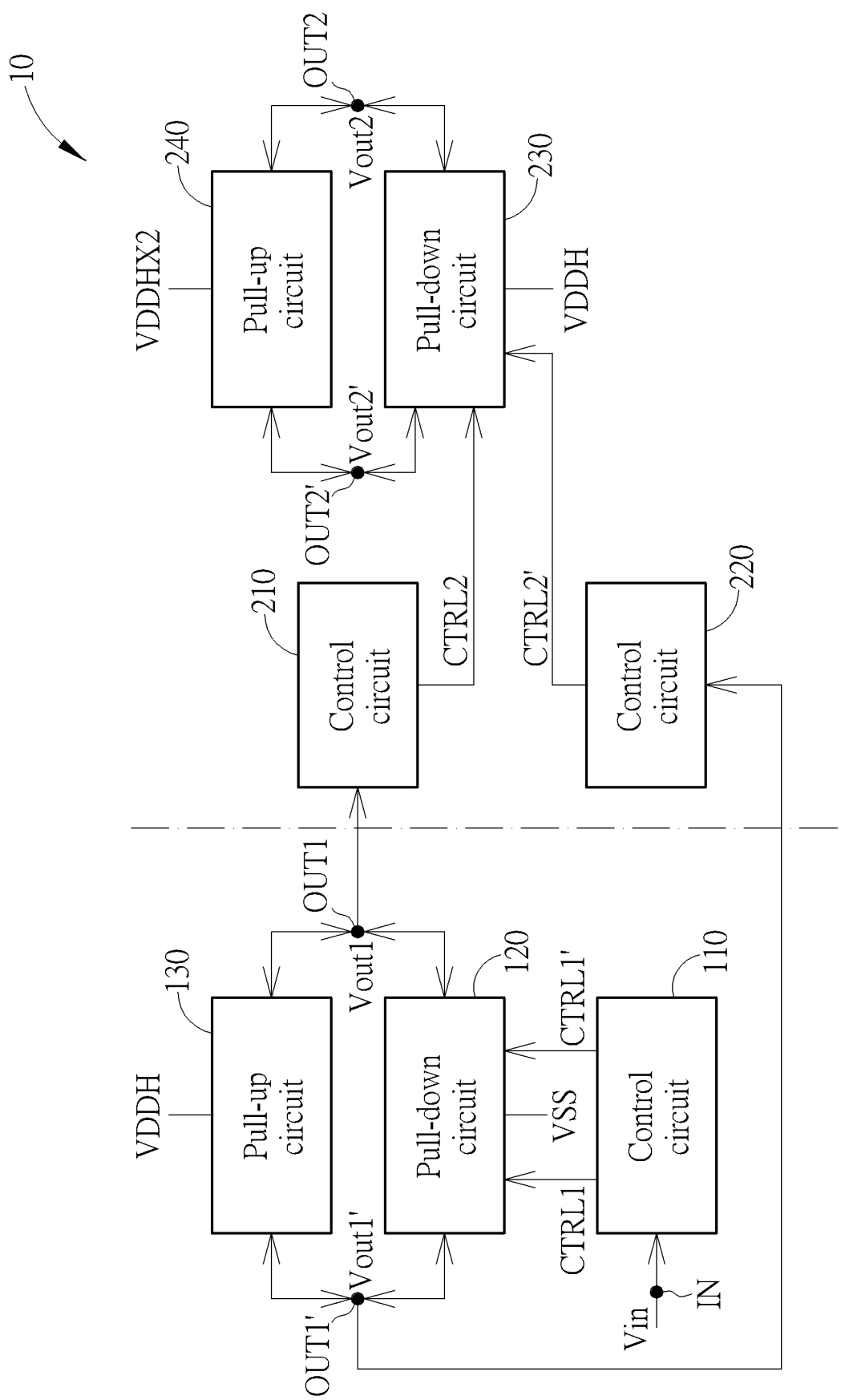
FIG. 1 is a diagram illustrating a voltage level shifter circuit according to an embodiment of the present invention.

FIG. 1 is a diagram illustrating a voltage level shifter circuit 10 according to an embodiment of the present invention, where the voltage level shifter circuit 10 shown in FIG. 1 may be divided into a first partial circuit (left side of the dashed line) and a second partial circuit (right side of the dashed line). The first partial circuit comprises a control circuit 110, a pull-down circuit 120 and a pull-up circuit 130, and the second partial circuit comprises control circuits 210 and 220, a pull-down circuit 230 and a pull-up circuit 240. The control circuit 110 receives an input voltage Vin from an input terminal IN, and generates a control signal CTRL1 and a control signal CTRL1'. The pull-down circuit 120 determines whether to pull down a first inverse output voltage Vout1' on the first inverse output terminal OUT1' to a reference voltage VSS according to the control signal CTRL1, and determines whether to pull down a first output voltage Vout1 on the first output terminal OUT1 to the reference voltage VSS according to the control signal CTRL1'. The pull-up circuit 130 determines whether to pull up the first output voltage Vout1 on the first output terminal OUT1 to a reference voltage VDDH according to the first inverse output voltage Vout1' on the first inverse output terminal OUT1', and determines whether to pull up the first inverse output voltage Vout1' on the first inverse output terminal OUT1' to the reference voltage VDDH according to the first output voltage Vout1 on the first output terminal OUT1.

The control circuit 210 receives the first output voltage Vout1 from the first output terminal OUT1, and generates a control signal CTRL2 according to the first output voltage Vout1. The control circuit 220 receives the first inverse output voltage Vout1' from the first inverse output terminal OUT1', and generates a control signal CTRL2' at least according to the first inverse output voltage Vout1'. The pull-down circuit 230 determines whether to pull down a second inverse output voltage Vout2' on a second inverse output terminal OUT2' to the reference voltage VDDH according to the control signal CTRL2, and determines whether to pull down a second output voltage Vout2 on a second output terminal OUT2 to the reference voltage VDDH according to the control signal CTRL2'. The pull-up circuit 240 determines whether to pull up the second output voltage Vout2 on the second output terminal OUT2 to a third reference voltage such as the reference voltage VDDHX2 (which stands for VDDH*2) according to the second inverse output voltage Vout2' on the second output terminal OUT2', and determines whether to pull up the second inverse output voltage Vout2' on the second output terminal OUT2' to the reference voltage VDDHX2 according to the second output voltage Vout2 on the second output terminal OUT2. Please note that, the present invention is not limited to that a first inverse output voltage and a second inverse output voltage have to be inverse outputs of a first output voltage and a second output voltage, and the term "inverse" is only for naming the terminals, voltages or signals. In addition, in this embodiment, the reference voltage VSS may be the lowest voltage level within the voltage level shifter circuit 10, for example, the reference voltage VSS may be a ground voltage. The reference voltage VDDH is the highest voltage level that can be applied to the voltage level shifter circuit 10 regarding the semiconductor process utilized for manufacturing the voltage level shifter circuit 10, that is, the nominal voltage. The reference voltage VDDHX2 has a voltage level which is twice the voltage level of the reference voltage VDDH.

Figure 2:
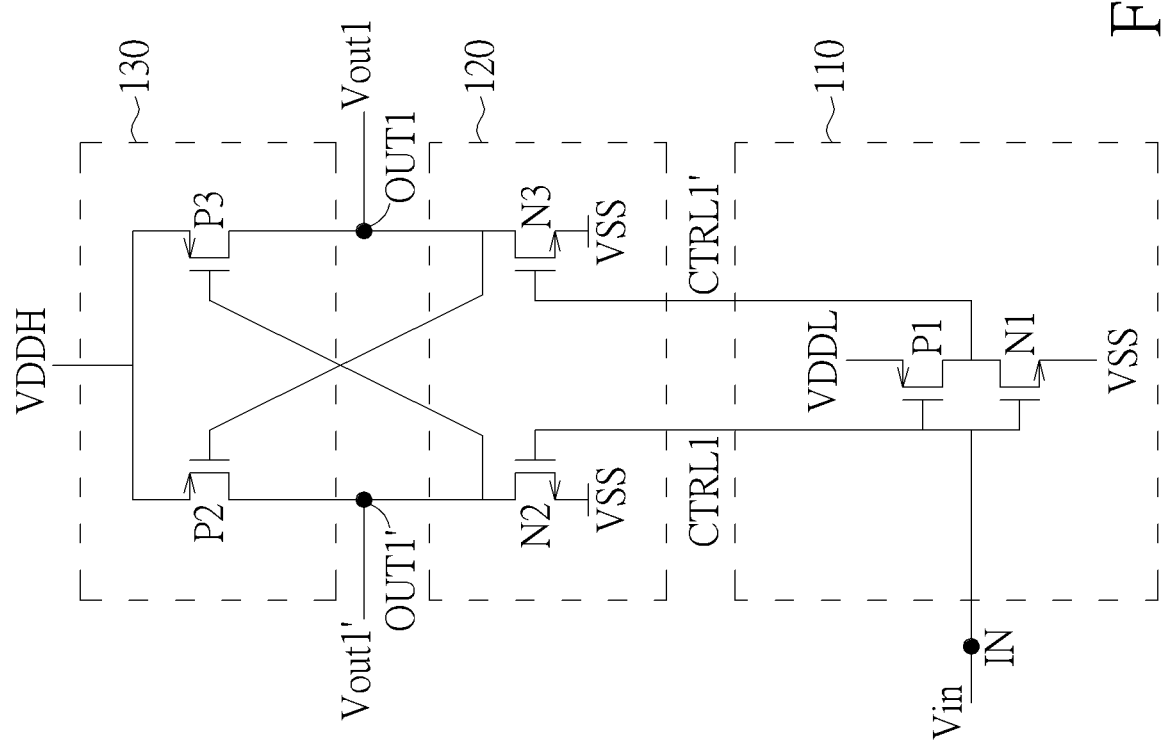
FIG. 2 is a diagram illustrating a first partial circuit of the voltage level shifter circuit shown in FIG. 1.

FIG. 2 is a diagram illustrating the first partial circuit of the voltage level shifter circuit 10 shown in FIG. 1. As shown in FIG. 2, the control circuit 110 comprises an inverter composed of a P-type Metal-Oxide-Semiconductor Field-Effect Transistor (MOSFET) (which is referred to as PMOSFET for brevity) P1 and an N-type MOSFET (which is referred to as NMOSFET for brevity) N1, where the input terminal IN is coupled to gate terminals of the PMOSFET P1 and the NMOSFET N1, and an inverse signal of the input voltage Vin is generated on the output terminal of the inverter. In addition, the inverter is coupled between the reference voltage VSS and a reference voltage VDDL. In this embodiment, the reference voltage VDDL is greater than the reference voltage VSS, but less than the reference voltage VDDH. In this embodiment, the input voltage Vin is the control signal CTRL1, and the inverse signal of the input voltage Vin is the control signal CTRL1'. The pull-down circuit 120 comprises NMOSFETs N2 and N3. A source terminal, a gate terminal and a drain terminal of the NMOSFET N2 are coupled to the reference voltage VSS, the control signal CTRL1 and the first inverse output terminal OUT1', respectively. A source terminal, a gate terminal and a drain terminal of the NMOSFET N3 are coupled to the reference voltage VSS, the control signal CTRL1' and the first output terminal OUT1, respectively. The pull-up circuit 130 comprises PMOSFETs P2 and P3. A drain terminal, a gate terminal and a source terminal of the PMOSFET P2 are coupled to the first inverse output terminal OUT1', the first output terminal OUT1 and the reference voltage VDDH, respectively. A drain terminal, a gate terminal and a source terminal of the PMOSFET P3 are coupled to the first output terminal OUT1, the first inverse output terminal OUT1' and the reference voltage VDDH, respectively.

Figure 3:
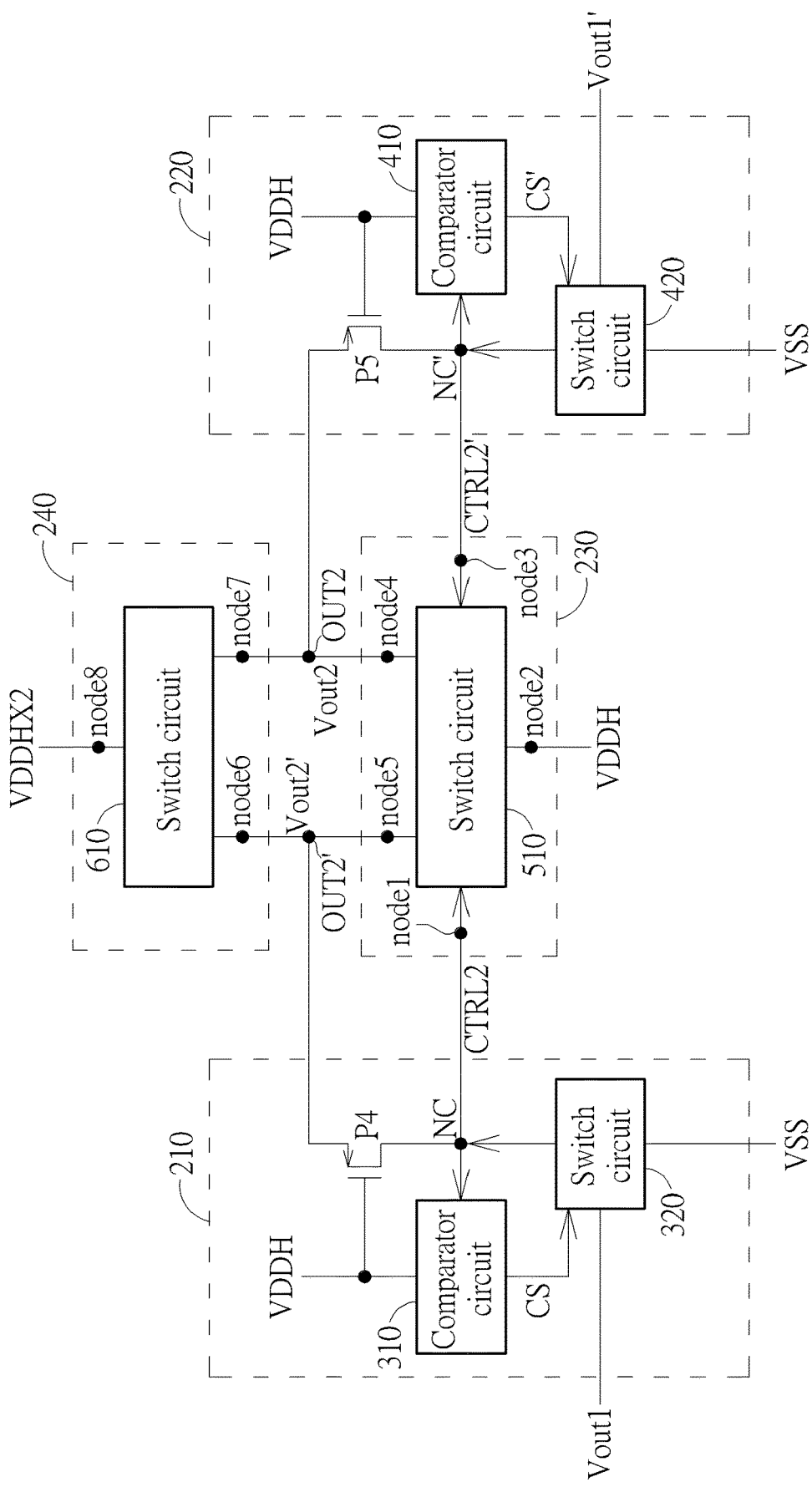
FIG. 3 is a diagram illustrating a second partial circuit of the voltage level shifter circuit shown in FIG. 1.

FIG. 3 is a diagram illustrating the second partial circuit of the voltage level shifter circuit 10 shown in FIG. 1. The control circuit 210 comprises a comparator circuit 310, a switch circuit 320, a PMOSFET P4 and a control terminal NC, where the control circuit 210 transmits the control signal CTRL2 to the pull-down circuit 230 through the control terminal NC. The comparator circuit 310 compares the control signal CTRL2 with the reference voltage VDDH to output a comparison result CS to the switch circuit 320. The switch circuit 320 generates the control signal CTRL2 according to the comparison result CS and the first output voltage Vout1. A source terminal and a drain terminal of the PMOSFET P4 are coupled to the second inverse output terminal OUT2' and the control terminal NC, respectively, and a gate terminal of the PMOSFET P4 receives the reference voltage VDDH. Relatively, the control circuit 220 comprises a comparator circuit 410, a switch circuit 420, a PMOSFET P5 and a control terminal NC', where the control circuit 220 transmits the control signal CTRL2' to the pull-down circuit 230 through the control terminal NC'. The comparator circuit 410 compares the control signal CTRL2' with the reference voltage VDDH to output a comparison result CS' to the switch circuit 420. The switch circuit 420 generates the control signal CTRL2' according to the comparison result CS' and the first inverse output voltage Vout1'. A source terminal and a drain terminal of the PMOSFET P5 are coupled to the second output terminal OUT2 and the control terminal NC', respectively, and a gate terminal of the PMOSFET P5 receives the reference voltage VDDH.

The pull-down circuit 230 comprises terminals {node1, node2, node3, node4, node5} and a switch circuit 510, where the terminals {node1, node2, node3, node4, node5} are coupled to the control terminal NC, the reference voltage VDDH, the control terminal NC', the second output terminal OUT2 and the second inverse output terminal OUT2', respectively. When the control signal CTRL2 instructs to make the switch circuit 510 conductive, the switch circuit 510 may pull down the second inverse output voltage Vout2' on the second inverse output terminal OUT2' to the reference voltage VDDH. Similarly, when the control signal CTRL2' instructs to make the switch circuit 510 conductive, the switch circuit 510 may pull down the second output voltage Vout2 on the second output terminal OUT2 to the reference voltage VDDH.

The pull-up circuit 240 comprises terminals {node6, node7, node8} and a switch circuit 610, where the terminals {node6, node7, node8} are coupled to the second inverse output terminal OUT2', the second output terminal OUT2 and the reference voltage VDDHX2, respectively. When the second inverse output voltage Vout2' instructs to make the switch circuit 610 conductive, the switch circuit 610 may pull up the second output voltage Vout2 on the second output terminal OUT2 to the reference voltage VDDHX2. Similarly, when the second output voltage Vout2 instructs to make the switch circuit 610 conductive, the switch circuit 610 may pull up the second inverse output voltage Vout2' on the second inverse output terminal OUT2' to the reference voltage VDDHX2.

Figure 4:
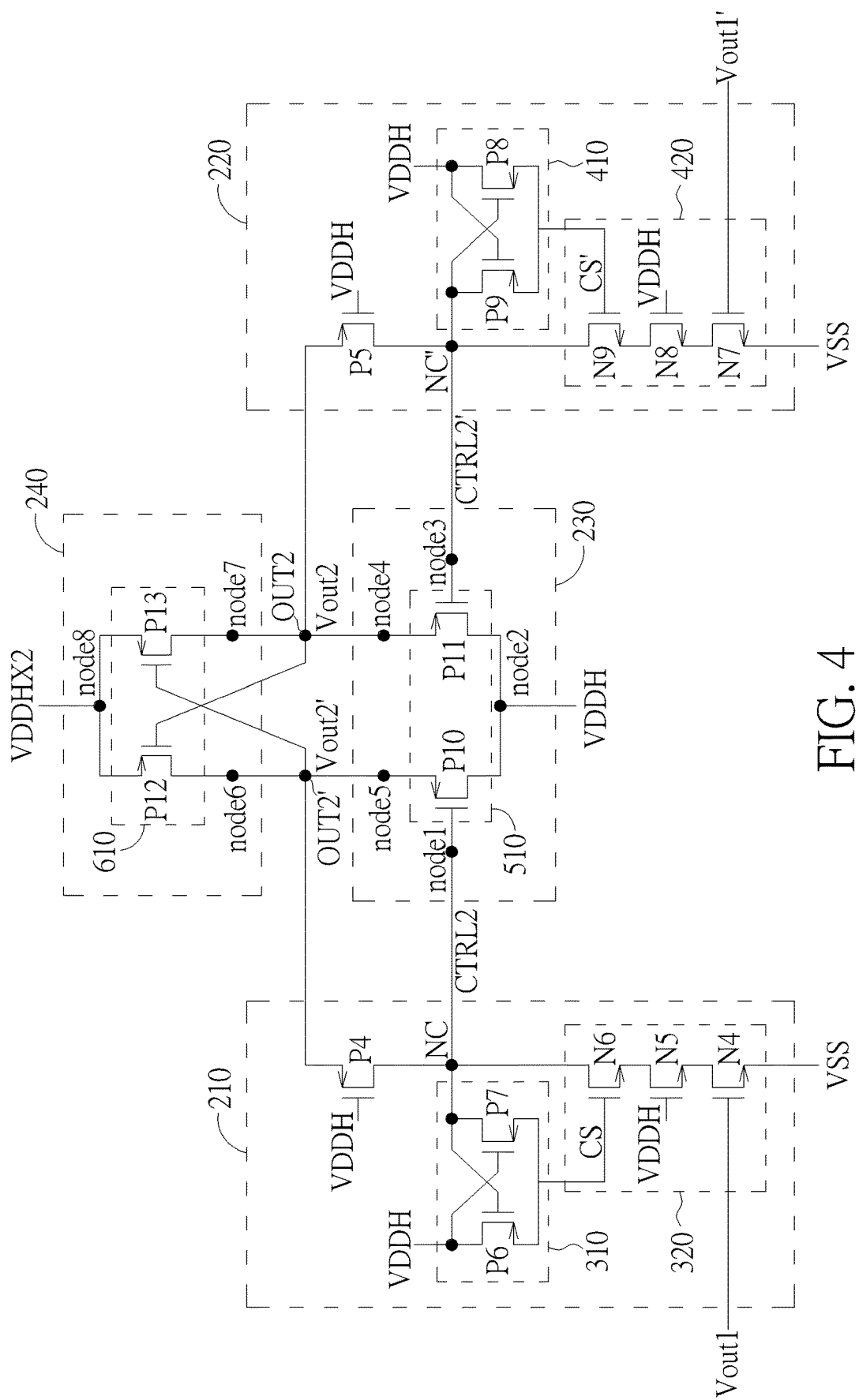
FIG. 4 is a diagram illustrating the second partial circuit in FIG. 3 according to an embodiment of the present invention.

FIG. 4 is a diagram illustrating the second partial circuit in FIG. 3 according to an embodiment of the present invention. The comparator circuit 310 within the control circuit 210 comprises PMOSFETs P6 and P7. A drain terminal and a gate terminal of the PMOSFET P6 are coupled to the reference voltage VDDH and the control terminal NC, respectively. A drain terminal and a gate terminal of the PMOSFET P7 are coupled to the control terminal NC and the reference voltage VDDH, respectively. Source terminals of PMOSFETs P6 and P7 are connected with each other. The comparator circuit 310 compares the reference voltage VDDH with the control signal CTRL2, and outputs the greater one to be the comparison result CS. The switch circuit 320 within the control circuit 210 comprises NMOSFETs N4, N5 and N6 which are connected in cascode structure, and gate terminals of the NMOSFETs N4, N5 and N6 receives the first output voltage Vout1, the reference voltage VDDH and the comparison result CS transmitted by the comparator circuit 310, respectively. In addition, a source terminal of the NMOSFET N4 is coupled to the reference voltage VSS, and a drain terminal of the NMOSFET N6 is coupled to the control terminal NC. When both the comparison result CS and the first output voltage Vout1 instruct to make the switch circuit 320 conductive (i.e. when the comparison result CS makes the NMOSFET N6 conductive and the first output voltage Vout1 makes the NMOSFET N4 conductive), the switch circuit 320 may transmit the reference voltage VSS to the control terminal NC to be the control signal CTRL2.

Relatively, the comparator circuit 410 within the control circuit 220 comprises PMOSFETs P8 and P9. A drain terminal and a gate terminal of the PMOSFET P8 are coupled to the reference voltage VDDH and the control terminal NC', respectively. A drain terminal and a gate terminal of the PMOSFET P9 are coupled to the control terminal NC' and the reference voltage VDDH, respectively. Source terminals of PMOSFETs P8 and P9 are connected with each other. The comparator circuit 410 compares the reference voltage VDDH with the control signal CTRL2', and output the greater one to be the comparison result CS'. The switch circuit 420 within the control circuit 220 comprises NMOSFETs N7, N8 and N9 which are connected in cascode structure, and gate terminals of the NMOSFETs N7, N8 and N9 receives the first inverse output voltage Vout1', the reference voltage VDDH and the comparison result CS' transmitted by the comparator circuit 410, respectively. In addition, a source terminal of the NMOSFET N7 is coupled to the reference voltage VSS, and a drain terminal of the NMOSFET N9 is coupled to the control terminal NC'. When both the comparison result CS' and the first inverse output voltage Vout1' instruct to make the switch circuit 420 conductive (i.e. when the comparison result CS' makes the NMOSFET N9 conductive and the first inverse output voltage Vout1' makes the NMOSFET N7 conductive), the switch circuit 420 may transmit the reference voltage VSS to the control terminal NC' to be the control signal CTRL2'.

The Switch circuit 510 within the pull-down circuit 230 comprises PMOSFETs P10 and P11. A source terminal, a gate terminal and a drain terminal of the PMOSFET P10 are coupled to the second inverse output terminal OUT2', the control terminal NC and the reference voltage VDDH, respectively. A source terminal, a gate terminal and a drain terminal of the PMOSFET P11 are coupled to the second output terminal OUT2, the control terminal NC', and the reference voltage VDDH, respectively. When the control signal CTRL2 makes the PMOSFET P10 within the switch circuit 510 conductive, the switch circuit 510 may transmit the reference voltage VDDH to the second inverse output terminal OUT2', to pull down the second inverse output voltage Vout2' to the reference voltage VDDH. Relatively, when the control signal CTRL2' makes the PMOSFET P11 within the switch circuit 510 conductive, the switch circuit 510 may transmit the reference voltage VDDH to the second output terminal OUT2, to pull down the second output voltage Vout2 to the reference voltage VDDH.

The Switch circuit 610 within the pull-up circuit 240 comprises PMOSFETs P12 and P13, where a source terminal, a gate terminal and a drain terminal of the PMOSFET P12 are coupled to the reference voltage VDDHX2, the second output terminal OUT2 and the second inverse output terminal OUT2', respectively. A source terminal, a gate terminal and a drain terminal of the PMOSFET P13 are coupled to the reference voltage VDDHX2, the second inverse output terminal OUT2' and the second output terminal OUT2, respectively. When the second output voltage Vout2 on the second output terminal OUT2 makes the PMOSFET P12 within the switch circuit 610 conductive, the switch circuit 610 may transmit the reference voltage VDDHX2 to the second inverse output terminal OUT2', to pull up the second inverse output voltage Vout2' to the reference voltage VDDHX2. Relatively, when the second inverse output voltage Vout2' on the second inverse output terminal OUT2' makes the PMOSFET P13 within the switch circuit 610 conductive, the switch circuit 610 may transmit the reference voltage VDDHX2 to the second output terminal OUT2, to pull up the second output voltage Vout2 to the reference voltage VDDHX2.

Figure 5:
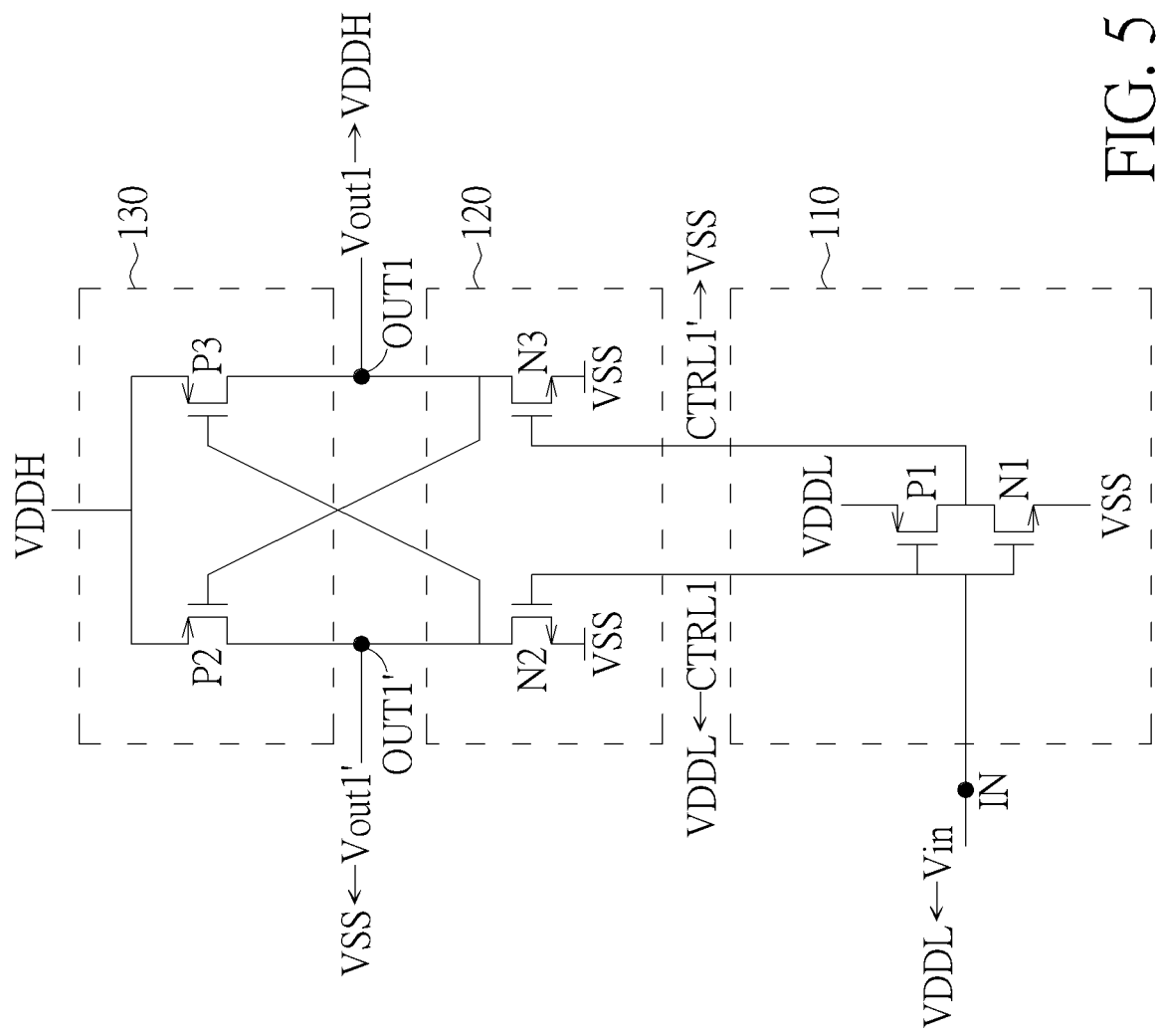
FIG. 5 is a diagram illustrating operations of the first partial circuit within the level shifter circuit according to an embodiment of the present invention.

FIG. 5 is a diagram illustrating operations of the first partial circuit within the level shifter circuit 10 according to an embodiment of the present invention. When the input voltage Vin is the reference voltage VDDL, the control signal CTRL1 may turn on the NMOSFET N2 to pull down the first inverse output voltage Vout1' on the first inverse output terminal OUT1' to the reference voltage VSS, and thereby turns on the PMOSFET P3 to pull up the first output voltage Vout1 on the first output terminal OUT1 to the reference voltage VDDH. On the other hand, since the input voltage is the reference voltage VDDL, the control signal CTRL1' becomes the reference voltage VSS through the operation of the inverter and turn off the NMOSFET N3. At this moment, a voltage level of the first output voltage Vout1 on the first output terminal OUT1 is the reference voltage VDDH, and a voltage level of the first inverse output voltage Vout1' on the first inverse output terminal OUT1' is the reference voltage VSS.

Figure 6:
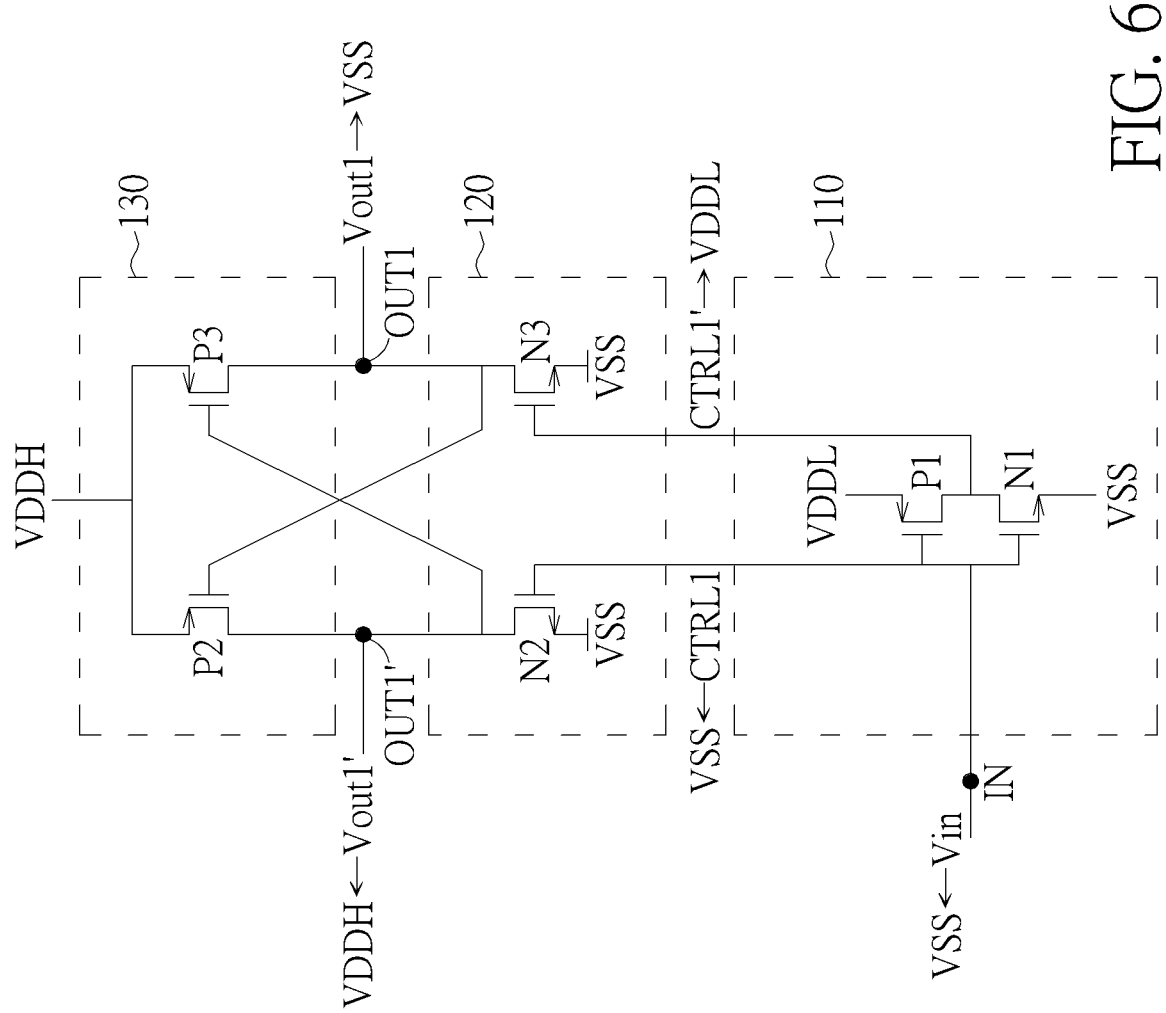
FIG. 6 is a diagram illustrating operations of the first partial circuit within the level shifter circuit according to another embodiment of the present invention.

FIG. 6 is a diagram illustrating operations of the first partial circuit within the level shifter circuit 10 according to another embodiment of the present invention. When the input voltage Vin is the reference voltage VSS, the control signal CTRL1' may become the reference voltage VDDL through the operation of the inverter, so the NMOSFET N3 may be turned on to pull down the first output voltage Vout1 on the first output terminal OUT1 to the reference voltage VSS, and thereby turns on the PMOSFET P2 to pull up the first inverse output voltage Vout1' on the first inverse output terminal OUT1' to the reference voltage VDDH. On the other hand, the control signal CTRL1 is also the reference voltage VSS, so the NMOSFET N2 is turned off. At this moment, the voltage level of the first output voltage Vout1 on the first output terminal OUT1 is the reference voltage VSS, and the voltage level of the first inverse output voltage Vout1' on the first inverse output terminal OUT1' is the reference voltage VDDH.

Figure 7:
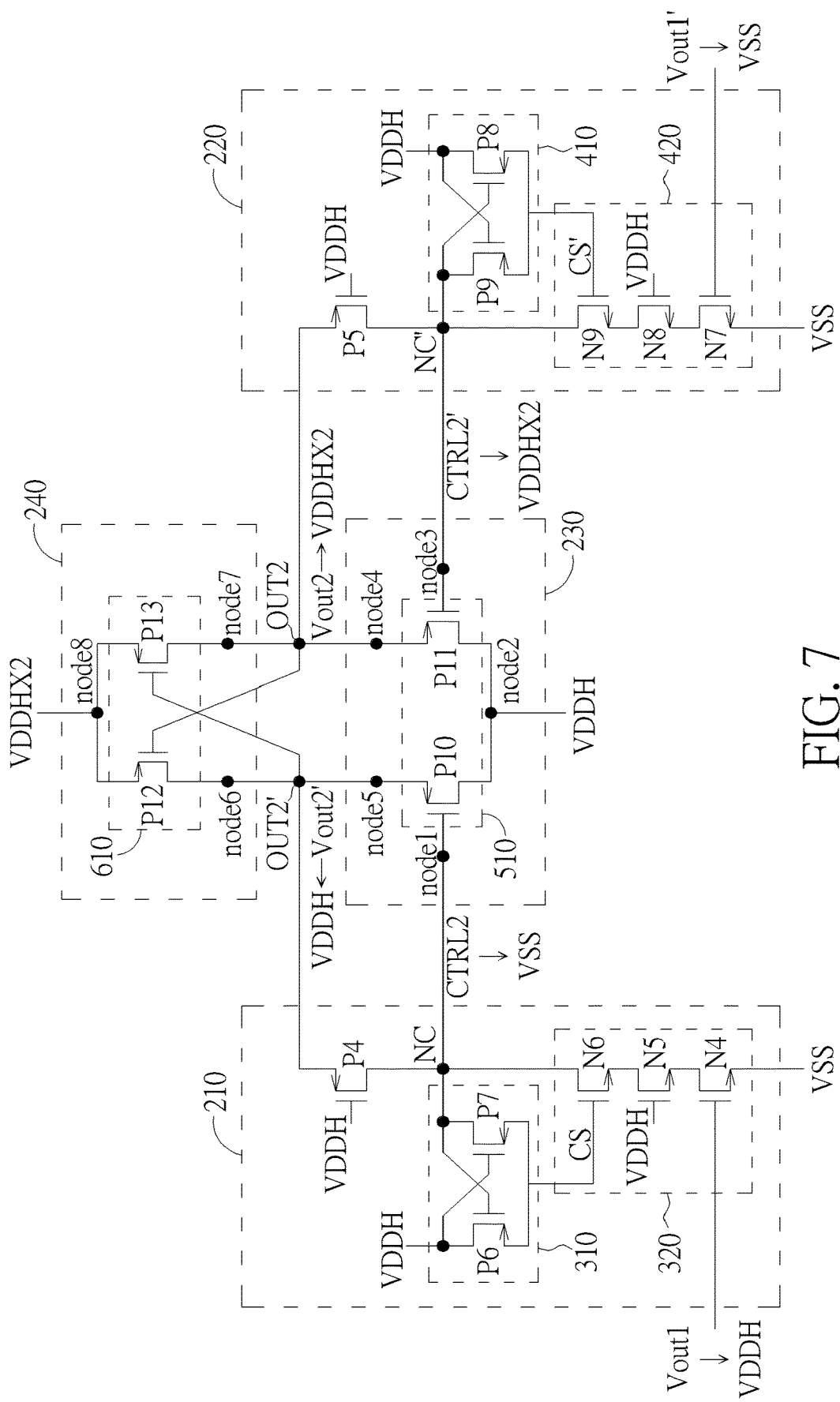
FIG. 7 is a diagram illustrating operations of the second partial circuit within the level shifter circuit according to an embodiment of the present invention.

FIG. 7 is a diagram illustrating operations of the second partial circuit within the level shifter circuit 10 according to an embodiment of the present invention. When the voltage level of the first output voltage Vout1 is the reference voltage VDDH, the first output voltage Vout1 and the comparison result CS may make the NMOSFETs N4-N6 conductive, and the switch circuit 320 may transmit the reference voltage VSS to the control terminal NC. Thus, a voltage level of the control signal CTRL2 is the reference voltage VSS. Since the reference voltage VSS is the lowest voltage level, it may make the PMOSFET P10 conductive to pull down the voltage level of the second inverse output voltage Vout2' on the second inverse output terminal OUT2' to the reference voltage VDDH, and thereby makes the PMOSFET P13 conductive to pull up the second output voltage Vout2 on the second output terminal OUT2 to the reference voltage VDDHX2 and turns off the PMOSFET P12. In addition, since the second output voltage Vout2 is pulled up to the reference voltage VDDHX2, the PMOSFET P5 may become conductive to transmit the reference voltage VDDHX2 to the control terminal NC' to turn off the PMOSFET P11. At this moment, since the voltage level of the first inverse output voltage Vout1' is the reference voltage VSS, the NMOSFET N7 may be turned off. At this moment, the voltage level of the second output voltage Vout2 on the second output terminal OUT2 is the reference voltage VDDHX2, and the voltage level of the second inverse output voltage Vout2' on the second inverse output terminal OUT2' is the reference voltage VDDH.

Figure 8:
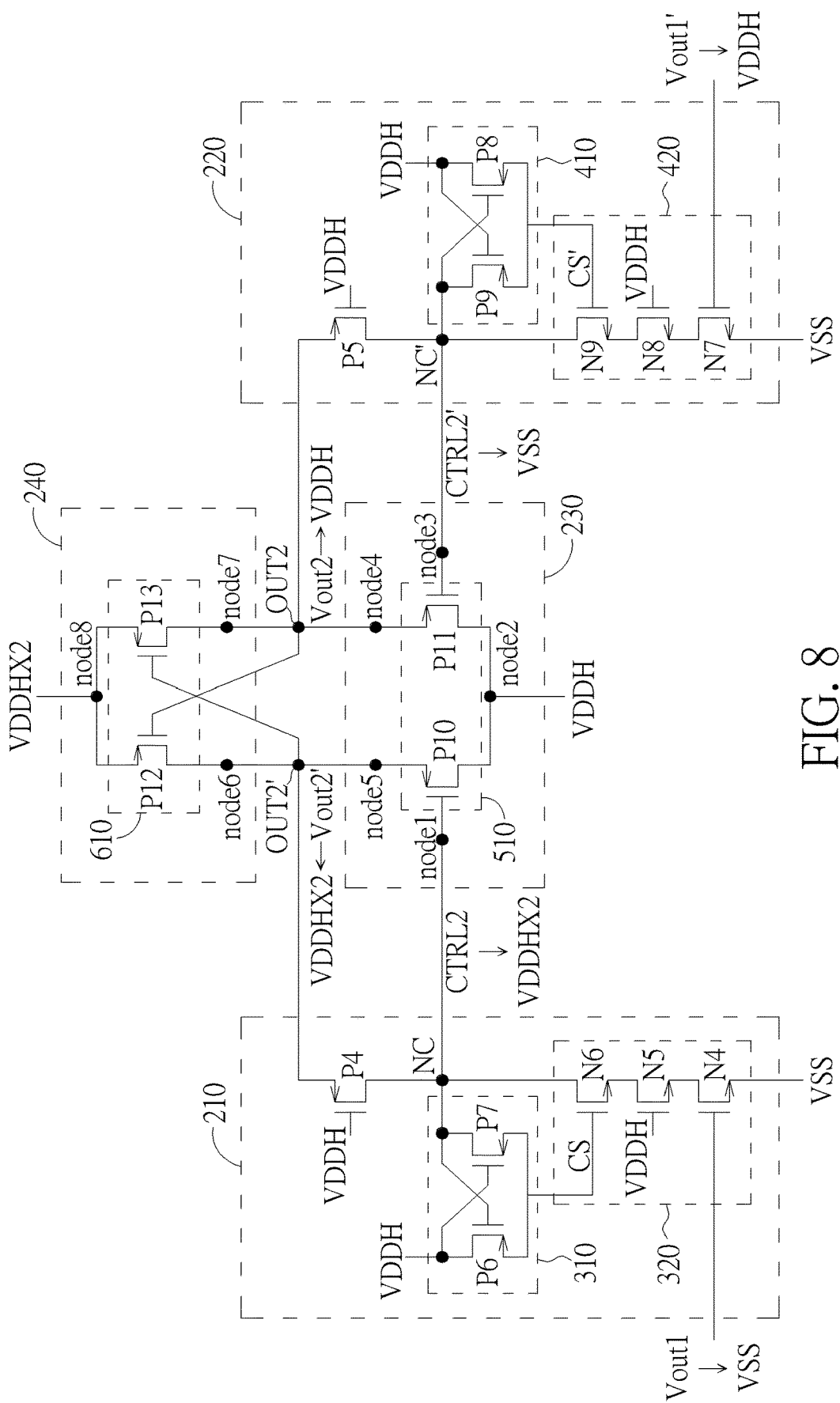
FIG. 8 is a diagram illustrating operations of the second partial circuit within the level shifter circuit according to an embodiment of the present invention.

FIG. 8 is a diagram illustrating operations of the second partial circuit within the level shifter circuit 10 according to an embodiment of the present invention. When the voltage level of the first inverse output voltage Vout1' is the reference voltage VDDH, the first inverse output voltage Vout1' and the comparison result CS' may make the NMOSFETs N7-N9 conductive, and the switch circuit 420 may transmit the reference voltage VSS to the control terminal NC'. Thus, a voltage level of the control signal CTRL2' is the reference voltage VSS. Since the reference voltage VSS is the lowest voltage level, it may make the PMOSFET P11 conductive to pull down the voltage level of the second output voltage Vout2 on the second output terminal OUT2 to the reference voltage VDDH, and thereby makes the PMOSFET P12 conductive to pull up the second inverse output voltage Vout2' on the second inverse output terminal OUT2' to the reference voltage VDDHX2 and turns off the PMOSFET P13. In addition, since the second inverse output voltage Vout2' is pulled up to the reference voltage VDDHX2, the PMOSFET P4 may become conductive to transmit the reference voltage VDDHX2 to the control terminal NC to turn off the PMOSFET P10. At this moment, since the voltage level of the first output voltage Vout1 is the reference voltage VSS, the NMOSFET N4 may be turned off. At this moment, the voltage level of the second inverse output voltage Vout2' on the second inverse output terminal OUT2' is the reference voltage VDDHX2, and the voltage level of the second output voltage Vout2 on the second output terminal OUT2 is the reference voltage VDDH.

Through the above descriptions of the operations in the embodiments shown in FIGS. 5-8, it is clear that, after the proposed architecture of the present invention receives the input voltage Vin, the reference voltage VDDHX2 can be obtained on the second output terminal OUT2 or the second inverse output terminal OUT2' to thereby implement a voltage level shifter. Additionally, through the proposed structure of the present invention, voltage difference between two terminals of any transistor within the voltage level shifter will not exceed the nominal voltage, where the risk of damaging component can be greatly reduced in order to reduce costs to solve problems of related art.

After reading the above descriptions, those skilled in the art should be able to understand that when there is a need to implement voltage level shifters with higher multiples, it can be easily implemented only by copying the proposed second partial circuit structure of the present invention. Thus, any voltage level shifter utilizing the second partial circuit of the present invention should belong to the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage level shifter circuit, comprising:
an input terminal, a first output terminal, a first inverse output terminal, a second output terminal and a second inverse output terminal;
a first control circuit, arranged to receive an input voltage from the input terminal and generate a first control signal;
a first pull-down circuit, coupled to the first control circuit, wherein the first pull-down circuit determines whether to pull down a voltage level of a first output voltage on the first output terminal to a first reference voltage according to the first control signal;
a first pull-up circuit, coupled to the first pull-down circuit, wherein the first pull-up circuit determines whether to pull up the first output voltage on the first output terminal to a second reference voltage according to a first inverse output voltage on the first inverse output terminal, wherein the second reference voltage is greater than the first reference voltage;
a second control circuit, coupled to the first output terminal, wherein the second control circuit generates a second control signal at least according to the first output voltage;
a second pull-down circuit, coupled to the second control circuit, wherein the second pull-down circuit determines whether to pull down a voltage level of a second output voltage on the second output terminal to the second reference voltage according to the second control signal; and
a second pull-up circuit, coupled to the second pull-down circuit, wherein the second pull-up circuit determines whether to pull up the second output voltage on the second output terminal to a third reference voltage according to a second inverse output voltage on the second inverse output terminal, wherein the third reference voltage is greater than the second reference voltage;
wherein the second control circuit comprises:
a control terminal, coupled to the second pull-down circuit, wherein the second control circuit transmit the second control signal to the second pull-down circuit through the control terminal;
a comparator circuit, coupled to the control terminal, wherein the comparator circuit is arranged to compare the second control signal with the second reference voltage to output a comparison result and
a switch circuit, coupled to the comparator circuit and the control terminal, wherein the switch circuit is arranged to generate the second control signal according to the comparison result and the first output voltage.

2. The voltage level shifter circuit of claim 1, wherein the comparator circuit comprises:
   a first Metal-Oxide-Semiconductor Field-Effect Transistor (MOSFET), wherein a gate terminal and a drain terminal of the first MOSFET are coupled to the second reference voltage and the control terminal, respectively; and
   a second MOSFET, wherein a gate terminal and a drain terminal of the second MOSFET are coupled to the control terminal and the second reference voltage, respectively;
   wherein source terminals of the first MOSFET and the second MOSFET are coupled to the switch circuit.

3. The voltage level shifter circuit of claim 2, wherein the switch circuit comprises:
   a third MOSFET, a fourth MOSFET and a fifth MOSFET, wherein the third MOSFET, the fourth MOSFET and the fifth MOSFET form cascode structure;
   wherein a gate terminal of the third MOSFET receives the first output signal, and a source terminal of the third MOSFET is coupled to the first reference voltage, a gate terminal of the fourth MOSFET is coupled to the second reference voltage, a gate terminal of the fifth MOSFET is coupled to the source terminal of the first MOSFET, and a drain terminal of the fifth MOSFET is coupled to the control terminal.

4. The voltage level shifter circuit of claim 1, wherein the second control circuit further comprises:
   a Metal-Oxide-Semiconductor Field-Effect Transistor (MOSFET), wherein a gate terminal a source terminal, and a drain terminal of the MOSFET are coupled to the second reference voltage, the second inverse output terminal and the control terminal, respectively.

5. The voltage level shifter circuit of claim 1, wherein the second pull-down circuit comprises:
   a switch circuit, coupled to the second control circuit, wherein a first terminal of the switch circuit receives the second control signal, and a second terminal and a third terminal of the switch circuit are coupled to the second reference voltage and the second output terminal, respectively;
   wherein when the second control signal instructs to make the switch circuit conductive, the switch circuit transmits the second reference voltage to the second output terminal, to pull down a voltage level of the second output voltage on the second output terminal to the second reference voltage.

6. The voltage level shifter circuit of claim 1, wherein the second pull-up circuit comprises:
   a switch circuit, coupled to the second pull-down circuit, wherein a first terminal of the switch circuit receives the second inverse output voltage, a second terminal and a third terminal of the switch circuit are coupled to the second output terminal and the third reference voltage, respectively;
   wherein when the second inverse output voltage instructs to make the switch circuit conductive, the switch circuit transmits the third reference voltage to the second output terminal, to pull up a voltage level of the second output voltage on the second output terminal to the third reference voltage.

7. The voltage level shifter circuit of claim 6, wherein the switch circuit comprises:

a P-type Metal-Oxide-Semiconductor Field-Effect Transistor (MOSFET), wherein a gate terminal, a drain terminal, and a source terminal of the P-type MOSFET are coupled to the first terminal, the second terminal, and the third terminal, respectively.

8. The voltage level shifter circuit of claim 1, wherein the first control circuit comprises:
   an inverter, comprising a first terminal, a second terminal, a third terminal and a fourth terminal;
   wherein the inverter receives the input voltage through the first terminal and generates the first control signal on the fourth terminal, the second terminal is coupled to the first reference voltage, the third terminal is coupled to a fourth reference voltage, and the fourth reference voltage is greater than the first reference voltage and less than the second reference voltage.

9. The voltage level shifter circuit of claim 8, wherein the first pull-down circuit receives the input voltage and the first control signal, and further determines whether to pull down the first inverse output voltage on the first inverse output terminal to the first reference voltage according to the input voltage.

10. The voltage level shifter circuit of claim 8, wherein the first pull-up circuit further determines whether to pull up the first inverse output voltage on the first inverse output terminal to the second reference voltage according to the first output voltage on the first output terminal.

11. The voltage level shifter circuit of claim 8, further comprising:
    a third control circuit, coupled to the first inverse output terminal, wherein the third control circuit generates a third control signal at least according to the first inverse output voltage.

12. The voltage level shifter circuit of claim 11, wherein the second pull-down circuit further determines whether to pull down the voltage level of the second inverse output voltage on the second inverse output terminal to the second reference voltage according to the third control signal.

13. The voltage level shifter circuit of claim 11, wherein the second pull-up circuit further determines whether to pull up the second inverse output voltage on the second inverse output terminal to the third reference voltage according to the second output voltage on the second output terminal.

14. A voltage level shifter circuit, comprising:
    an input terminal, a first output terminal, a first inverse output terminal, a second output terminal and a second inverse output terminal;
    a first control circuit, arranged to receive an input voltage from the input terminal and generate a first control signal;
    a first pull-down circuit, coupled to the first control circuit, wherein the first pull-down circuit determines whether to pull down a voltage level of a first output voltage on the first output terminal to a first reference voltage according to the first control signal;
    a first pull-up circuit, coupled to the first pull-down circuit, wherein the first pull-up circuit determines whether to pull up the first output voltage on the first output terminal to a second reference voltage according to a first inverse output voltage on the first inverse output terminal, wherein the second reference voltage is greater than the first reference voltage;
    a second control circuit, coupled to the first output terminal, wherein the second control circuit generates a second control signal at least according to the first output voltage;

a second pull-down circuit, coupled to the second control circuit, wherein the second pull-down circuit determines whether to pull down a voltage level of a second output voltage on the second output terminal to the second reference voltage according to the second control signal; and a second pull-up circuit, coupled to the second pull-down circuit, wherein the second pull-up circuit determines whether to pull up the second output voltage on the second output terminal to a third reference voltage according to a second inverse output voltage on the second inverse output terminal, wherein the third reference voltage is greater than the second reference voltage;

wherein the second pull-down circuit comprises:
a switch circuit, coupled to the second control circuit, wherein a first terminal of the switch circuit receives the second control signal, and a second terminal and a third terminal of the switch circuit are coupled to the second reference voltage and the second output terminal, respectively;

wherein when the second control signal instructs to make the switch circuit conductive, the switch circuit transmits the second reference voltage to the second output terminal, to pull down a voltage level of the second output voltage on the second output terminal to the second reference voltage;

wherein the switch circuit comprises:
a P-type Metal-Oxide-Semiconductor Field-Effect Transistor (MOSFET), wherein a gate terminal a drain terminal, and a source terminal of the p-type MOSFET are coupled to the first terminal, the second terminal, and the third terminal, respectively.

* * * * *